(12) United States Patent
Lin

(10) Patent No.: US 7,948,279 B2
(45) Date of Patent: May 24, 2011

(54) CLOCK DIVIDER

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/472,197

(22) Filed: May 26, 2009

(65) Prior Publication Data

US 2009/0230999 A1 Sep. 17, 2009

Related U.S. Application Data

(63) Continuation of application No. 11/183,642, filed on Jul. 18, 2005, now Pat. No. 7,538,590.

(51) Int. Cl.
H03K 21/00 (2006.01)
(52) U.S. Cl. ............................ 327/115; 327/118; 337/47
(58) Field of Classification Search .................. 327/115, 327/117, 118
See application file for complete search history.

(56) References Cited

U.S. PATENT DOCUMENTS

| | | | |
|---|---|---|---|
| 3,679,913 A | 7/1972 | Foltz | |
| 3,937,982 A * | 2/1976 | Nakajima | 326/98 |
| 4,922,527 A * | 5/1990 | Nonami | 379/361 |
| 5,095,225 A | 3/1992 | Usui | |
| 5,907,589 A * | 5/1999 | Koifman et al. | 377/47 |
| 6,069,495 A | 5/2000 | Ciccone et al. | |
| 6,166,571 A | 12/2000 | Wang | |
| 6,249,157 B1 * | 6/2001 | Nakura et al. | 327/117 |
| 6,448,831 B1 * | 9/2002 | Hunt et al. | 327/211 |
| 6,566,918 B1 * | 5/2003 | Nguyen | 327/115 |
| 6,714,057 B2 * | 3/2004 | Nguyen | 327/115 |
| 6,759,886 B2 * | 7/2004 | Nakanishi | 327/295 |
| 6,822,491 B1 * | 11/2004 | Glass | 327/115 |
| 7,030,674 B2 | 4/2006 | Johnson | |
| 7,049,864 B2 | 5/2006 | Kelkar et al. | |
| 7,113,009 B2 * | 9/2006 | Sun et al. | 327/115 |
| 7,248,665 B2 | 7/2007 | Shi et al. | |
| 7,298,810 B2 * | 11/2007 | Ke | 377/48 |
| 7,319,345 B2 | 1/2008 | Farjad-rad et al. | |
| 2003/0107417 A1 * | 6/2003 | Roberts et al. | 327/144 |
| 2005/0057285 A1 * | 3/2005 | Austin et al. | 327/115 |
| 2005/0253630 A1 * | 11/2005 | Huang et al. | 327/115 |

FOREIGN PATENT DOCUMENTS

| | | |
|---|---|---|
| TW | 360789 | 6/1999 |
| TW | 367653 | 8/1999 |

OTHER PUBLICATIONS

Notification Concerning Transmittal of International Preliminary Report on Patenability, PCT/US2006/028045, Jul. 17, 2006.

* cited by examiner

Primary Examiner — Thomas J Hiltunen
(74) Attorney, Agent, or Firm — Fletcher Yoder

(57) ABSTRACT

There is provided a true single phase logic clock divider that is configured to selectively divide a clock signal by increments of two, three, four, or six. Because the true single phase logic clock divider is based on true single phase logic instead of static logic, the true single phase logic clock divider is able to reliably divide clock signals that could not reliably be divided by clock dividers based on static logic gates. The true single phase logic clock divider is capable of reliably operating at frequencies of greater than or equal to two gigahertz.

5 Claims, 4 Drawing Sheets

CLOCK DIVIDER

CROSS-REFERENCE TO RELATED APPLICATIONS

This application is a continuation of and claims priority to U.S. patent application Ser. No. 11/183,642, filed on Jul. 18, 2005, now U.S. Pat. No. 7,538,590 which issued on May 26, 2009.

BACKGROUND OF THE INVENTION

1. Field of the Invention

The present invention relates generally to integrated circuits and, more particularly, to a clock divider employing true single phase logic.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Clocking circuits are employed in a wide variety of digital circuits and devices to synchronize operations across devices, circuit boards, or integrated circuits. For a variety of reasons, however, a single clock frequency is often not sufficient to accommodate every device or circuit in a complex computer or other electronic device. For this reason, many computers or digital devices employ multiple clock signals at different frequencies. For example, in some computers, a central processing unit may be clocked by a first clock signal at a first clock frequency, while the memory is clocked by a second clock signal at a second, different clock frequency. Rather than employ multiple clocks, most systems derive alternate clock frequencies from a single base clock frequency, which is typically the clock signal used for the central processing unit. Implementing clock dividers provides one technique for performing this derivation.

As most people are aware, computers and computer-related technologies have been steadily increasing in computing power and complexity over the past several years. One popular technique for increasing the computing power of a computer is to increase the clock speed of the central processing unit within the computer. For example, many central processing units now operate with clock speeds of two to four gigahertz or more. Most conventional clock dividers, however, are not suitable for dividing clock signals in this frequency range, because most conventional clock dividers employ static logic gates and flip-flops that have internal logic gate delays and set-up times that are slower than the period (i.e., 1/frequency) of clock signals above two gigahertz. In other words, conventional, static-logic-based clock dividers are often too slow to accurately divide clock signals with frequencies above two gigahertz.

Embodiments of the present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

There is provided a true single phase logic clock divider that is configured to divide a clock signal by increments of two, three, four, or six. Because the true single phase logic clock divider is based on true single phase logic instead of static logic, the true single phase logic clock divider is able to reliably divide clock signals that could not reliably be divided by clock dividers based on static logic gates. There is also provided a method comprising receiving an input signal with a frequency between 2.5 gigahertz and 4 gigahertz and producing an output signal with a frequency approximately one-third of the frequency of the input signal.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described above, conventional clock dividers employ static logic gates and flip-flops to divide the frequency of a clock signal. Static logic gates employ Complimentary Metal Oxide Semiconductors ("CMOS") based circuits that include both p-type (PMOS) and n-type (NMOS) Metal Oxide Semiconductor Field Effect Transistors ("MOSFETs"). These static gates are designed to always produce an output that is a logical function of the inputs regardless of the passage of time. Most static logic gates and flip-flops, however, have set-up and delay times of 500 picoseconds ("ps") or more. Disadvantageously, many modern central processor units operate at clock frequencies with periods below 500 ps. For this reason, conventional static-logic-based clock dividers are often too slow to divide the clock signals in modern computers. Embodiments of the present technique employ dynamic logic to provide clock dividers to overcome this disadvantage.

Dynamic logic, on the other hand, has lower delay times, because dynamic logic has employs a primarily NMOS MOSFETS and uses the precharge to evaluate logic. Further, unlike static logic flip-flops, dynamic logic flip-flop only use one phase clock instead of two phase clocks. One type of dynamic logic is also referred to as True Single Phase Logic ("TSPL"). TSPL-based logic circuits, logic gates, and flip-flops have delay times well below 500 ps. Embodiments of the present invention include a TSPL-based clock divider that is configurable to divide a clock signal by increments of two, three, four, or six.

Figure 1:
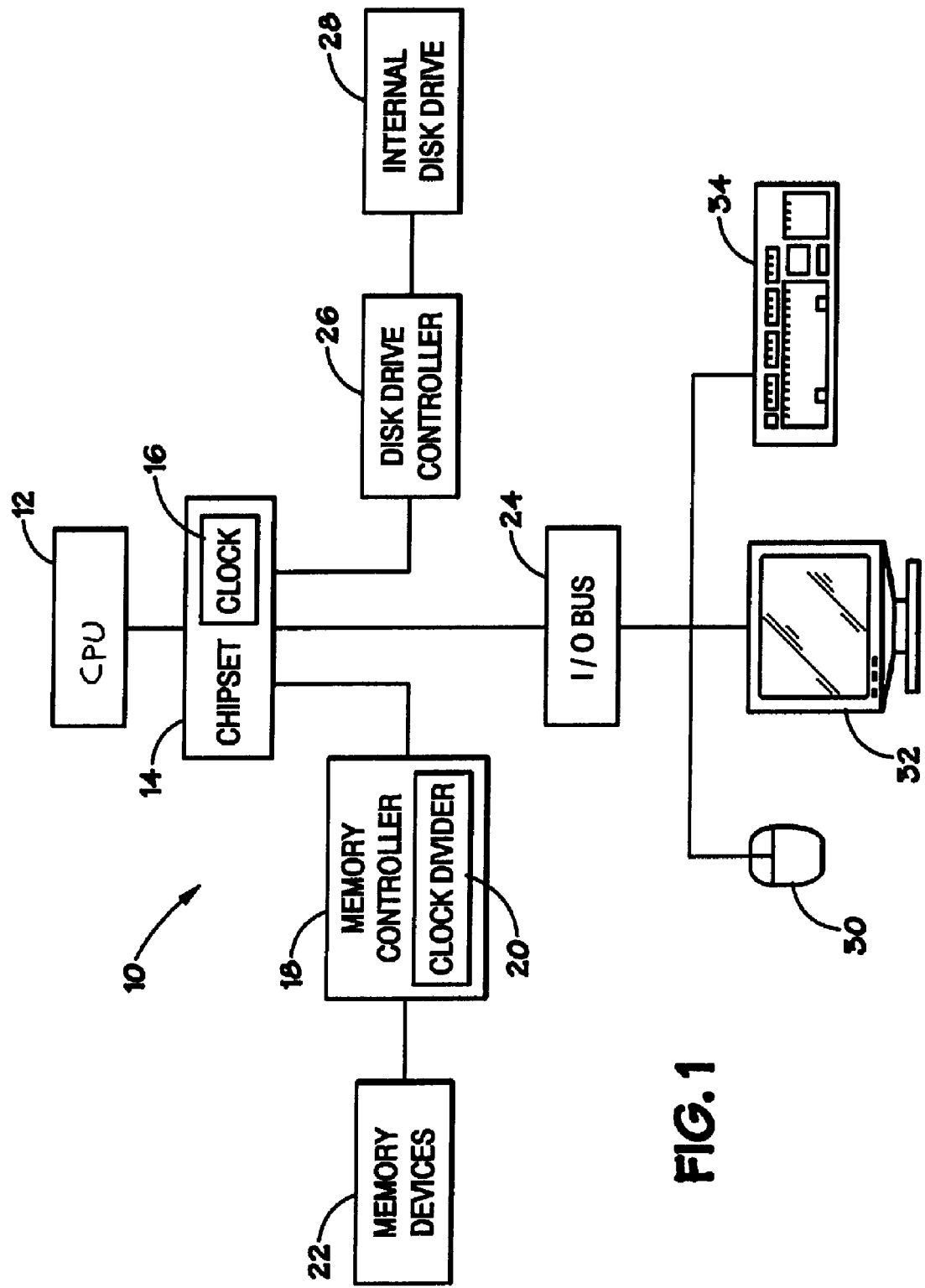
FIG. 1 illustrates an exemplary computer system employing a true single phase logic clock divider in accordance with embodiments of the present invention.

Turning initially to FIG. 1, a block diagram of an exemplary computer system employing a true single phase logic clock divider is illustrated and generally designated by a reference numeral 10. The system 10 may include one or more central processing units ("CPUs") 12. The CPU 12 may be used individually or in combination with other CPUs. While the CPU 12 will be referred to primarily in the singular, it will be understood by those skilled in the art that a system 10 with any number of physical or logical CPUs 12 may be implemented. Examples of suitable CPUs 12 include the Intel Pentium 4 processor and the AMD Athlon processor.

A chipset 14 may be operably coupled to the CPU 12. Amongst other functions, the chipset 14 may provide a communication pathway for signals between the CPU 12 and the other components of the system 10, which may include a memory controller 18, an input/output ("I/O") bus 24, and a disk drive controller 26. The chipset 14 may also comprise a system clock 16. The system clock 16 may comprise any one of a number of other clocking circuits, as well known to those skilled in the art. The chipset 14 may transmit a clock signal 46 (see FIG. 2) generated by the system clock 16 to the processor 12, the memory controller 18, the I/O bus 24, the disk drive controller 26, or any other suitable components of the system 10. In one embodiment, this clock signal 46 may be employed by the system 10 to synchronize the components of the system 10. Those skilled in the art, however, will appreciate that the routing of signals through the system 10 can be readily adjusted without changing the underline nature of the system.

As stated above, the memory controller 18 may be coupled to the chipset 14 and the system clock 16. In alternate embodiments, the memory controller 18 may be integrated into the chipset 14. In the embodiment illustrated in FIG. 1, the memory controller 18 comprises true single phase logic clock divider 20 that receives the clock signal 46 from the clock 16 and divides the clock signal 46, as appropriate, to produce one or more lower frequency clock signals for the memory devices 22. Those skilled in the art will also appreciate that the clock divider 20 is depicted within the memory controller 18 for exemplary purposes only. In alternate embodiments, the clock divider 20 may be employed within any other suitable components of the system 10, such as the I/O bus 24, the disk drive controller 26, or the memory devices 22. The memory devices 22, may be any one of a number of standard memory types, including but not limited to single inline memory modules ("SIMMs"), dual inline memory modules ("DIMMs), or double data rate memory devices ("DDR").

The chipset 14 may also be coupled to the I/O bus 24. The I/O bus 24 may serve as a communication pathway for signals from the chipset 14 from the I/O devices 30, 32, and 34. The I/O devices 30, 32, and 34 may include the mouse 30, the video display 32, or the keyboard 34. The I/O bus 24 may employ any one of a number of communication protocols to communicate with the I/O devices 30, 32, and 34. In alternate embodiments, the I/O bus 24 may be integrated into the chipset 14.

The disk drive controller 26 may also be coupled to the chipset 14. The disk drive controller 26 may serve as a communication pathway between the chipset 14 and one or more internal disk drives 28. The disk drive controller 26 and the internal disk drive 28 may communicate with each other or with the chipset using virtually any suitable type of communication protocol.

It is important to note that the system 10 described in regard to FIG. 1 is merely one example of a system employing the clock divider 20. In alternate embodiments, such as cellular phones, or digital cameras, the components may differ from the embodiment shown in FIG. 1.

Figure 2:
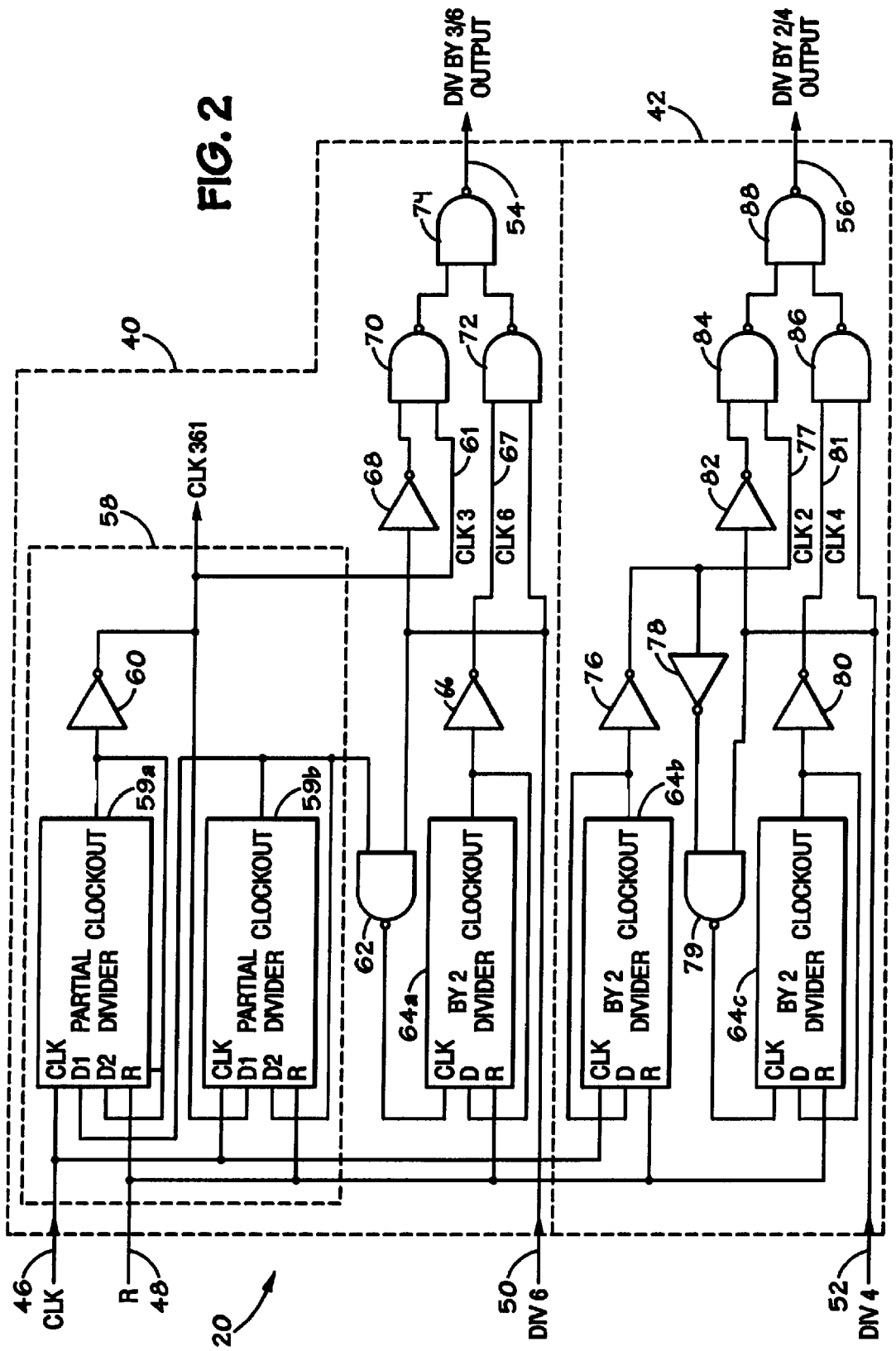
FIG. 2 illustrates the exemplary true single phase logic clock divider in accordance with embodiments of the present invention.

FIG. 2 is a diagram illustrating an exemplary clock divider 20 in accordance with embodiments of the present invention. As described below, the clock divider 20 is configurable to divide the clock signal 46 by two, three, four, or six. In other words, the clock divider 20 is configurable to output a clock signal with a frequency ½, ⅓, ¼, or ⅙ of the clock signal 46. While not illustrated in FIG. 2, those skilled in the art will appreciate that in alternate embodiments the clock divider 20 can be configured to divide the clock signal 46 by any suitable multiple of two, three, four, and six (i.e., nine, twelve, eighteen, etc.).

As illustrated, the clock divider 20, may comprise a Divide-by-3-or-6 circuit 40 and a Divide-by-2-or-4 circuit 42. As will be described further below, the Divide-by-3-or-6 circuit 40 is configured to divide the clock signal 46 by either three or six; whereas the Divide-by-2-or-4 circuit 42 is configured to divide the clock signal 46 by two or four. Those skilled in the art will appreciate that the clock divider 20 is illustrated with a single Divide-by-3-or-6 circuit 40 and a single Divide-by-2-or-4 circuit 42 for illustrative purposes only. In alternate embodiments, the clock divider 20 may comprise multiple Divide-by-3-or-6 circuits 40 or multiple Divide-by-2-or-4 circuits 42. Moreover, as described herein, the components of the Divide-by-3-or-6 circuit 40 and the Divide-by-2-or-4 circuit 42 may be reorganized or duplicated to create circuits configured to divide the clock signal 46 by dimensions other than those described.

The clock divider 20 may receive the clock signal 46, a reset signal 48, a divide by 6 flag 50, or a divide by 4 flag 52. The clock signal 46 may comprise the clock signal generated by a system clock 16 (shown in FIG. 1) or an output (see below) generated by another clock divider 20. One of ordinary skill in the art will appreciate that the reset signal 48 provides a mechanism to reset the clock divider 20 without having to stop the clock. In one embodiment, the clock divider 20 may reset if the reset signal 48 changes from a low voltage level ("low") to a high voltage level ("high").

The illustrated clock divider 20 also receives the divide by 6 flag 50 and the divide by 4 flag 52. In one embodiment, the divide by 6 flag 50 is a digital signal indicative of whether the clock divider 20 should divide the clock signal by 3 or by 6. Specifically, if the divide by 6 flag is high, the clock divider 20 may be configured to divide by 6 rather than by 3, whereas if the divide by 6 flag is low, the clock divider 20 may be configured to divide by 3 rather than 6. Similarly, the divide by 4 flag 52 may be indicative of whether the clock divider 20 should divide the clock signal 46 by 2 or by 4.

The clock divider 20 may output the divided clock signal via either a divide By ⅜ output 54 or a divide By ¾ output 56. Specifically, the clock signal 46 divided by either 3 or 6 may be transmitted from the clock divider 20 via the divide By ⅜ output 54, and the clock signal 46 divided by either 2 or 4 may be transmitted from the clock divider via the divide by ¾ output 56. In an alternate embodiment, the divide by 6 flag 50 and the divide by 4 flag 52 are consolidated into a single input indicative of dividing the clock signal 46 by either 4 or 6. Moreover, in yet another alternate embodiment, the clock divider 20 may comprise a single output to transmit any suitable permutation of clock division. In this embodiment, one or more additional logic signals may be employed to indicate which frequency (i.e., ½, ⅓, ⅙, etc.) of output is to be transmitted out of the clock divider 20.

Turning in more detail to the Divide-by-3-or-6 circuit 40, the Divide-by-3-or-6 circuit 40 may comprise a Divide-by-3 circuit 58. As its name indicates, the Divide-by-3 circuit 58 is configured to divide the frequency of the clock signal 46 by three to produce an output signal 61 with ⅓ the frequency of the clock signal 46. The Divide-by-3 circuit 58 is comprised of two Partial Divide-by-3 circuits 59a and 59b, which will be described in greater detail in relation to FIG. 4. As illustrated, each of the Partial Divide-by-3 circuits 59a and 59b may be have a clock input and a reset (R) input. The Partial Divide-by-3 circuits 59a and 59b are coupled to each other via their respective D1 and D2 inputs and their respective outputs which are labeled as "clockout" in FIGS. 2 and 4. In particular, the input D1 on the Partial Divide-by-3 circuit 59a may be coupled to the clockout of the Partial Divide-by-3 circuit 59b, the D2 input of the Partial Divide-by-3 circuit 59a may be coupled to the clockout output of the Partial Divide-by-3 circuit 59a, and the D2 input of the Partial Divide-by-3 circuit 59b may be coupled to the clockout output of the Partial Divide-by-3 circuit 59b. The D1 input of the Partial Divide-by-3 circuit 59b may be coupled to the clockout output signal from the Partial Divide-by-3 circuit 59a, inverted by an inverter 60. This inverted signal also comprises an output signal 61 from the Divide-by-3 circuit 58, which is illustrated as the CLK3 signal. As described above, the output signal 61 (CLK3) will have a frequency approximately ⅓ of the input clock signal 46. The output signal 61 is transmitted to a NAND gate 70, which is described in further detail below.

As illustrated in FIG. 2, the clockout signal from the Partial divider 59b and the divide by 6 flag 50 may be coupled to a NAND gate 62, which provides the CLK input to a Divide-by-2 circuit 64a. The Divide-by-2 circuit 64a is configured to further divide the clock signal 46 to produce a CLK 6 output signal 67, which has a frequency approximately ⅙ of the clock signal 46. The operation of the Divide-by-2 circuit 64a will be described in greater detail with regard to FIG. 3. The Divide-by-3-or-6 circuit 40 may also comprise inverters 66 and 68 as well as NAND gates 70, 72 and 74. The inverters 66 and 68 and the NAND gates 70, 72, and 74 receive signal inputs from the Divide-by-3 circuit 58 and the Divide-by-2 circuit 64a, and depending on the state of the divide by 6 flag 50, produce a clock signal (at the divide by ⅜ output 54) that exhibits a frequency either ⅓ or ⅙ of the frequency of the clock signal 6. Those skilled in the art will appreciate that the inverters 66 and 68 and the NAND gates 70, 72, and 74 are merely one embodiment of combinational logic suitable to select an output based on the state of the divide by 6 flag 50. In alternate embodiments, different combination logic schemes may be employed. For example, in one alternate the output of the Divide-by-2 circuit 64a may be used as the input to the Divide-by-3 circuit 58 to generate a frequency that is ⅙ of the frequency of the clock signal 46.

The Divide-by-2-or-4 circuit 42 may comprise a Divide-by-2 circuit 64b and a Divide-by-2 circuit 64c, each of which is configured to divide the frequency of an incoming clock signal (CLK) by 2. In one embodiment, the Divide-by-2 circuits 64b and 64c are identical to the Divide-by-2 circuit 64a described above in regard to the Divide-by-3 circuit 40. As illustrated, the Divide-by-2 circuit 64b may be coupled to the clock signal input 46. As such, the Divide-by-2 circuit 64b may be configured to divide the frequency of the clock signal 46 by two. The output from the Divide-by-2 circuit 64b may then be coupled to the Divide-by-2 circuit 64c via inverters 76 and 78 and NAND gate 79 to divide the output from the Divide-by-2 circuit 64b by two to produce a clock signal that has a frequency that is ¼ the frequency of the clock signal 46. The Divide-by-2-or-4 circuit 42 may also comprise inverters 80 and 82 as well as NAND gates 84, 86, and 88. The inverters 80 and 82 and the NAND gates 84, 86, and 88 are configured to receive outputs from the Divide-by-2 circuit 64b and the Divide-by-2 circuit 64c and output on a divide By ⅔ output 56 a clock signal with a frequency of either ½ or ¼ the frequency of the clock signal 46. Those skilled in the art will appreciate that the inverters 80 and 82 and the NAND gates 84, 86, and 88 are merely one embodiment of combinational logic suitable for selecting an output based on the state of the divide by 4 flag 52. In alternate embodiments, different combinational logic schemes may be employed.

Figure 3:
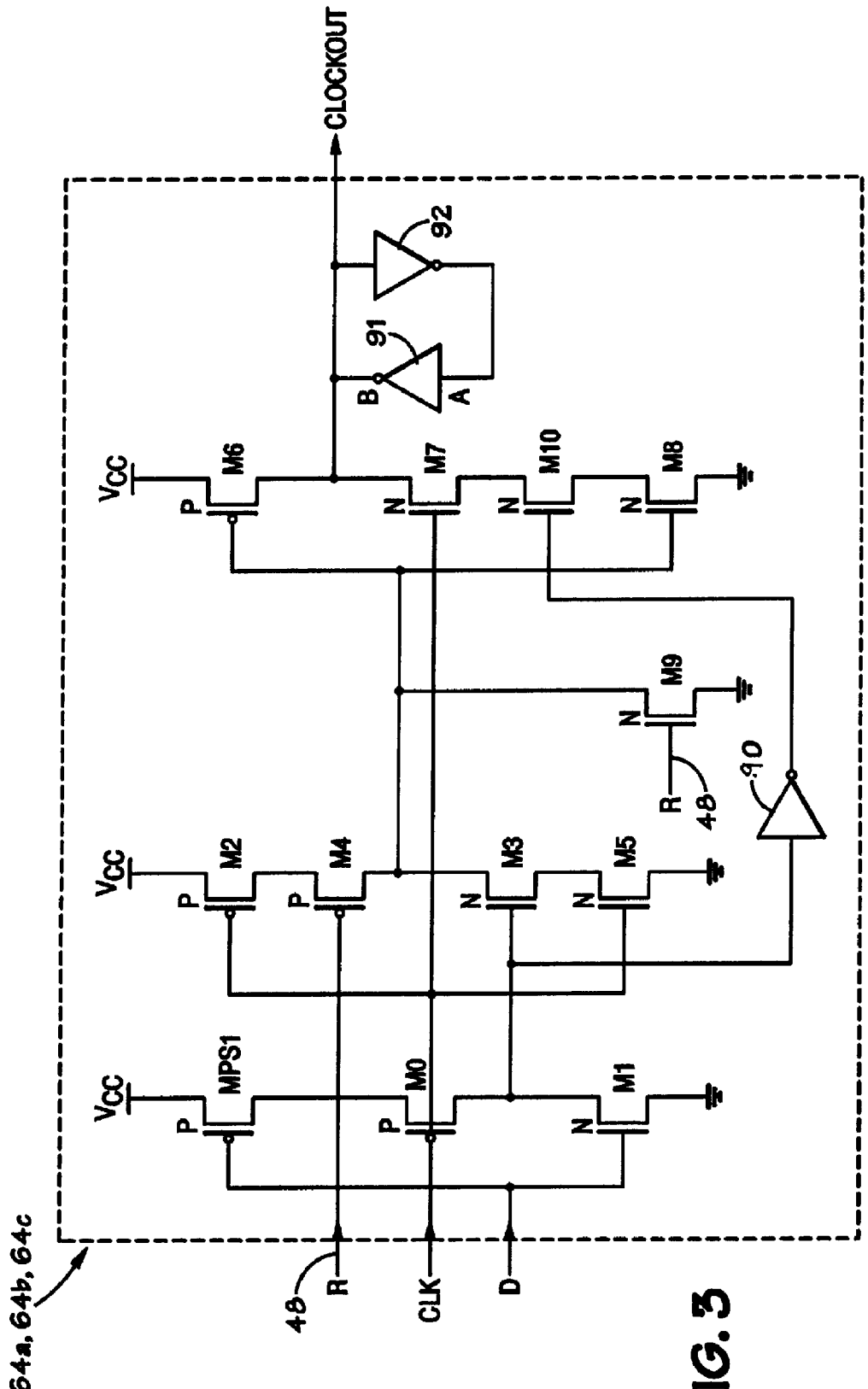
FIG. 3 is illustrates an exemplary Divide-by-2 circuit in accordance with embodiments of the present invention.

FIG. 3 is a schematic diagram of the Divide-by-2 circuit 64a, 64b, and 64c in accordance with embodiments of the present invention. Those skilled in the art will appreciate that the Divide-by-2 circuit 64a, 64b, and 64c illustrated in FIG. 3 is merely one exemplary embodiment of a circuit configured to perform the above described functions. In alternate embodiments, some of the below described components of the Divide-by-2 circuit 64a, 64b, or 64c may be rearranged or even absent and other components not illustrated may be present. The Divide-by-2 circuit 64a, 64b and 64c comprises a plurality of inputs illustrated in FIG. 3 as R, CLK, and D. In one embodiment, the R input carries the reset signal 48 that was discussed above in regard to FIG. 2. The CLK input carries a clock signal. In the embodiment illustrated in FIG. 2, the CLK input may receive the clock signal 46 or a clock signal with either ⅓ or ½ the frequency of the clock signal 46. Lastly, as illustrated in FIG. 2, the D input is coupled to the clockout of the Divide-by-2 circuit 64a, 64b, or 64c to create a feedback mechanism, as appreciated by one of ordinary skill in the art.

The Divide-by-2 circuit 64a, 64b, and 64c may comprise a plurality of transistors MPS1, M0, M1, M2, M3, M4, M5, M6, M7, M8, M9, and M10. Those skilled in the art will appreciate that the transistors MPS1 and M0-M10 may be connected to a power supply VCC, to a grounding source, and to inverters 90, 91, and 92, as illustrated. In one embodiment, the inverters 91 and 92 are used to store the clockout output (see FIG. 3). The Divide-by-2 circuit 64a, 64b, and 64c produces a clockout output signal that exhibits a frequency that is one-half the frequency of the CLK input. Moreover, because the transistors MPS1, and M0-M10 are configured as TSP logic, the Divide-by-2 circuits 64a, 64b, and 64c are able to function at clock frequencies at least up to and including four gigahertz. Those skilled in the art will appreciate that the inverters 90, 91, and 92 run at approximately half the speed of the clock signal 46, which enables the inverters 90, 91, and 92 to function at clock frequencies above two gigahertz. As such, the inverters 90, 91, and 92 do not detract from the performance of the Divide-by-2 circuit even though the inverters 90, 91, and 92 are not TSPL components.

Figure 4:
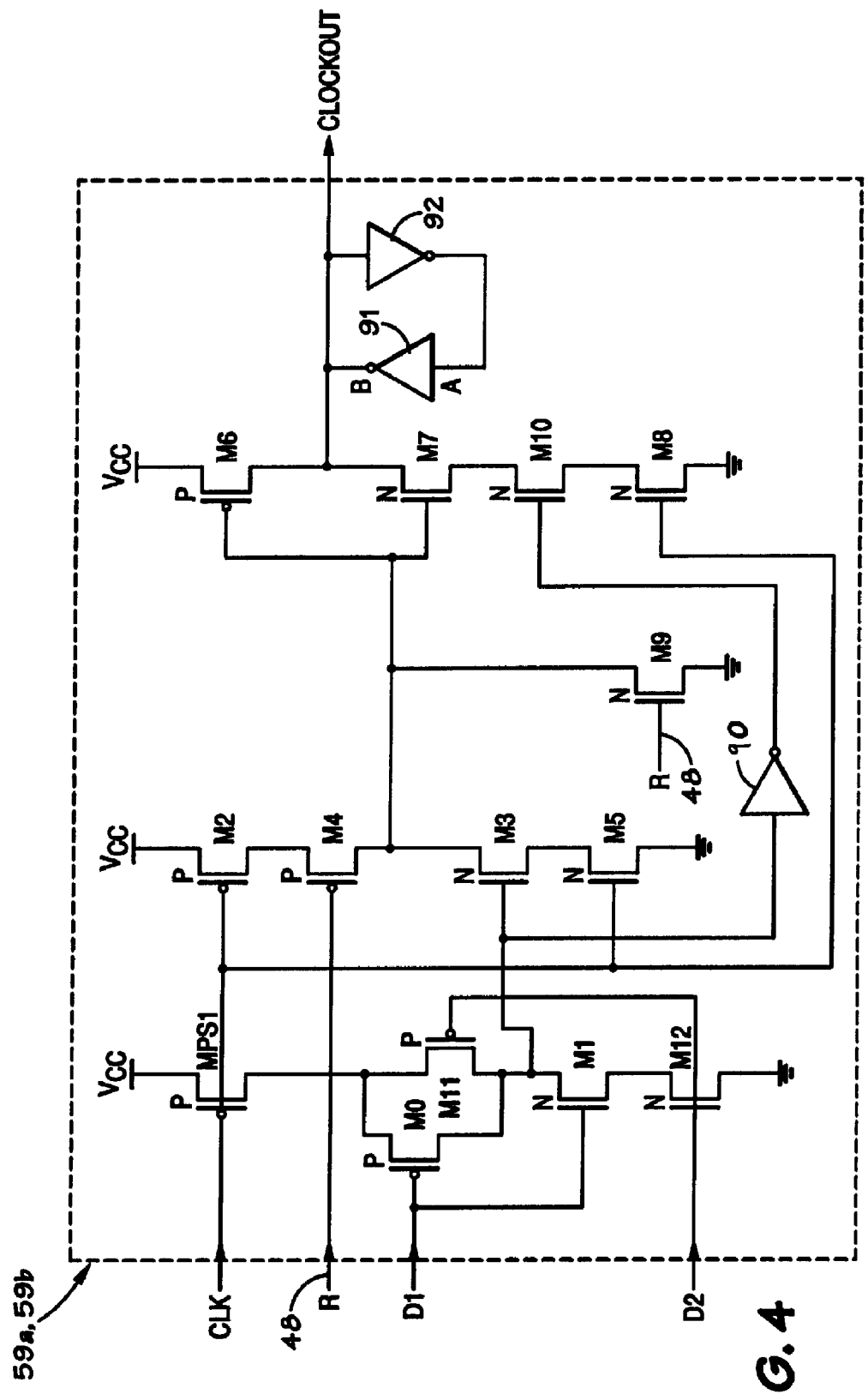
FIG. 4 illustrates an exemplary Partial Divide-by-3 circuit in accordance with embodiments of the present invention.

FIG. 4 is a schematic diagram illustrating the Partial Divide-by-3 circuit 59a and 59b in accordance with embodiments of the present invention. For simplicity, like reference labels have been used to designate those features previously describe in regard to FIG. 3. As described above, the Partial Divide-by-3 circuits 58a and 58b can be coupled together, as shown in FIG. 2, to produce the CLK3 output 61, which comprises a clock signal with a frequency ⅓ of the frequency of the clock signal 48.

As illustrated, the partial Divide-by-3 circuit 58a and 58b includes two additional transistors not present in the Divide-by-2 circuit 64a, 64b, and 64c. In particular, the partial Divide-by-3 circuit 58a and 58b comprises the transistor M11 and the transistor M12. As illustrated, the transistor M11 is coupled in parallel to the transistor M0 between the transistor MPS1 and the transistor M1. The transistor M12 is coupled in series between the transistor M1 and ground. In addition, a gate of the transistor M12 is coupled to an input D2, which was described above in reference to FIG. 2. In one embodiment, the transistors M0 and M11 comprise p-type transistors and the transistors M1 and M12 comprise n-type transistors.

Those skilled in the art will appreciate that the transistors M0, M1, M11, and M12, as illustrated, are configured to replace the static logic gates that are conventionally employed to create a Divide-by-3 circuit. Specifically, in one embodiment, the transistors M0, M1, M11, and M12 are configured to cause the partial Divide-by-3 circuit 58a and 58b to produce outputs in accordance with the following truth table.

TABLE 1

| Previous | | Next | |
|---|---|---|---|
| D1 | D2 | D1 | D2 |
| 1 | 1 | 0 | 1 |
| 1 | 0 | 1 | 1 |
| 0 | 1 | 1 | 0 |
| 0 | 0 | 1 | 1 | where D1 is the output signal from the partial Divide-by-3 circuit 59a and D2 is the output signal from the partial Divide-by-3 circuit 59b. Those of ordinary skill in the art will appreciate that in the Table 1 illustrated above, the next value for D1 is given by the previous value of D1 NAND the previous value of D2 and that the next value for D2 is given by the inverse of D1 NAND the previous value of D2.

Moreover, those skilled in the art will appreciate, however, that the alternate arrangements of the transistors M0, M1, M11, and M12 may be employed to create the partial Divide-by-3 circuit 59a and 59b in alternate embodiments. In these alternate embodiments, additional transistors (not shown) may be included or some of the illustrated transistors may be removed or altered.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A clock divider comprising:
   a first partial divider circuit configured to receive a single phase of a clock signal, a first data input, and a second data input; and
   a second partial divider circuit configured to receive the single phase of the clock signal, the first data input, and the second data input or a complement of the second data;
   wherein neither the first partial divider circuit or the second partial divider circuit receives any other clock signal or another phase of the clock signal and wherein the clock divider is configured to produce an output clock signal having a frequency of approximately one third of a frequency of the clock signal; and
   wherein the clock divider comprises dynamic logic gates configured to receive the first data input and the second data input.

2. A clock divider comprising:
   a first partial divider circuit configured to receive a single phase of a clock signal, a first data input, and a second data input; and
   a second partial divider circuit configured to receive the single phase of the clock signal, the first data input, and the second data input or a complement of the second data;
   wherein neither the first partial divider circuit or the second partial divider circuit receives any other clock signal or another phase of the clock signal and wherein the clock divider is configured to produce an output clock signal having a frequency of approximately one third of a frequency of the clock signal; and
   wherein each of the first partial divider circuit and the second partial divider circuit comprises:
      a first transistor and a second transistor configured to receive the first data input; and
      a third transistor and a fourth transistor configured to receive the second data input or the complement of the second data input.

3. The clock divider, as set forth in claim 2, wherein the first transistor and the third transistor are n-type transistors, and wherein the second transistor and the fourth transistor are p-type transistors.

4. The clock divider, as set forth in claim 2, wherein the first transistor and the third transistor are coupled to each other in parallel.

5. The clock divider, as set forth in claim 4, wherein the second transistor is coupled to each of the first transistor and the third transistor in series.

* * * * *